United States Patent [19]

Nordholt et al.

[11] Patent Number: 5,481,218
[45] Date of Patent: Jan. 2, 1996

[54] LOGARITHMIC CONVERTER

[75] Inventors: Ernst Nordholt, Berkel & Rodenrijs; Johannes Stoffels, Hague, both of Netherlands

[73] Assignee: Telefonaktiebolaget LM Ericsson, Stockholm, Sweden

[21] Appl. No.: 312,917

[22] Filed: Sep. 30, 1994

[51] Int. Cl.⁶ .................................................. G06F 7/556
[52] U.S. Cl. ............................................ 327/350; 327/351
[58] Field of Search .................................... 327/350, 351, 327/352

[56] References Cited

U.S. PATENT DOCUMENTS

| | | | |
|---|---|---|---|
| 3,569,736 | 3/1971 | Tschinkel | 307/230 |
| 3,790,819 | 2/1974 | Chamran | 307/229 |
| 4,990,803 | 2/1991 | Gilbert | 307/492 |
| 5,200,655 | 4/1993 | Feldt | 307/492 |
| 5,286,969 | 2/1994 | Roberts | 250/214 |
| 5,296,761 | 3/1994 | Fotowat-Ahmady et al. | 307/492 |

FOREIGN PATENT DOCUMENTS 517305  12/1992  European Pat. Off. .

*Primary Examiner*—Timothy P. Callahan
*Assistant Examiner*—Jeffrey Zweizig
*Attorney, Agent, or Firm*—Burns, Doane, Swecker & Mathis

[57] ABSTRACT

A logarithmic convertor based on a nonlinear successive detection principle has a temperature-compensated biassing arrangement and a large operating range due to a d.c. feedback network for offset reduction and an attenuating input stage permitting large input voltages. The log convertor exploits the exponential relationship between the collector current and base-emitter voltage of a bipolar transistor to render the convertor insensitive to temperature and process parameter variations. The converter is a cascade of sections, each having a constant-gain differential amplifier having a particularized current source. The constant-gain amplifier may include a Darlington differential pair, and the current sources have outputs that are either temperature-independent, or proportional to temperature.

10 Claims, 13 Drawing Sheets

LOGARITHMIC CONVERTER

BACKGROUND

Applicants' invention relates to circuit topologies for accurate logarithmic conversion of the envelope of a modulated signal.

In many types of radio receivers, logarithmic envelope detection is used in various ways for recovering the information transmitted. For example, in receivers for amplitude-modulated (AM) radio signals, log envelope detection can be used for demodulating the received AM signal. After exponential conversion, the original information, i.e., the modulation signal, becomes available. In a typical data receiver, the output of a log convertor provides one of the components needed to decompose the signal into its I and Q components. Furthermore, the d.c. level of the output of a logarithmic envelope detector is an indication of the received signal strength.

Log envelope detectors are known from several patent applications, technical papers, and circuit device catalogues. They are often configured as a cascade of limiting gain sections, each of which consists of a full-wave detector and an amplifier. Summing the output signals generated by the sections produces an accurate logarithm of the input signal.

One of the problems often encountered with these circuits is their sensitivity to parameter dispersion and temperature variations. This leads to rather large errors in the convertor's output voltage.

This sensitivity problem is often solved by measuring the transfer characteristics of each individual circuit and storing the measured transfer characteristics in a memory, such as a ROM, together with required corrections for temperature. Of course, the drawbacks of this strategy are the large effort required for collecting the measurements and the circuit overhead required for adequate error correction, e.g., the temperature must be measured by an additional temperature sensor.

Another problem is the operating range of a logarithmic envelope detector is usually determined by the noise level and the maximum allowable input level. The effective maximum input level is usually increased by using an attenuator to limit the amplitude of the input signal. Of course, the attenuator must not add too much noise or introduce extra temperature dependency. This aim is not always achieved in existing circuits.

One example of a logarithmic envelope detector is the AD640 device made by Analog Devices. The device contains a cascade of limiting gain sections, each consisting of a full-wave detector and an amplifier stage. The maximum input level is determined by an integrated attenuator, which is compensated for the effects of temperature variations, and the noise level is mainly determined by this attenuator.

U.S. Pat. No. 4,990,803 to Gilbert distinguishes between three basic types of logarithmic amplifier (or convertor): (1) using the exponential law of a PN junction; (2) analog-to-digital (A/D) conversion and digital log computation; and (3) successive detection or multi-stage conversion. Examples of the first basic type are described in U.S. Pat. No. 3,569,736 to Tschinkel; U.S. Pat. No. 3,790,819 to Chamran; U.S. Pat. No. 5,200,655 to Feldt; and U.S. Pat No. 5,286,969 to Roberts. Of more interest with respect to Applicants' invention is the third basic type, examples of which are described in the Gilbert patent and U.S. Pat. No. 5,296,761 to Fotowat-Ahmady et al. and European Patent Publication No. EP 0 517 305 to Fotowat-Ahmady et al.

The Gilbert patent describes a log amplifier having a plurality of d.c.-coupled gain stages that are based on differential amplifiers biassed by tail-current generators. The currents supplied by the current generators are proportional to absolute temperature and are compensated automatically for the effects of finite transistor beta and base and emitter resistances. Each stage includes a detector that is implemented by distinct components and that produces the stage's temperature-dependent logarithmic output current. Since each detector loads the forward signal path, emitter followers are included as counter measures.

In Gilbert's log amplifier, the accuracy of the log function increases as the gain decreases, which results in a larger number of sections for a given gain. Also, the gain, which is fixed by the tail currents, must be proportional to absolute temperature and must be compensated for base-current losses. The Gilbert patent stabilizes the gains of its differential-amplifier pairs by controlling the voltages across the collector resistors with an indirect feedback loop that includes a model differential pair. Although potentially more reliable than explicit compensation, all systematic errors (such as transistor beta errors) must be individually and expressly taken into account.

In the log detector described in Fotowat-Ahmady's European publication, like the amplifier described in the Gilbert patent, each stage includes a detector that is implemented by distinct components. On the other hand, the logarithmic output voltage is not obtained from the common emitters of the differential amplifier, but instead an extra differential pair is added at the collectors of the differential gain pair. This introduces more offset problems and influences the small-signal behavior of the gain section because the extra differential pair loads the gain section's output.

The outputs of Fotowat-Ahmady's extra differential pairs are connected to a sense amplifier, which is itself a differential pair. (The other input of the sense amplifier is connected to a dummy circuit.) The sense amplifier includes a resistor for adjusting its transfer gain, and this emitter degeneration resistor contributes to a reduction in the accuracy of the device. Accuracy is further reduced because the device's differential-amplifier tail currents are matched by trimming, which results in unpredictable temperature coefficients.

The log detector described in Fotowat-Ahmady's U.S. patent is different from the detector described in the European publication in a way that tends to improve the proportionality of the detector's response. Also, the bias-current organization in the device described in the U.S. patent is different from that described in the European publication, in which all current sources are intended to have the same temperature coefficient (a condition sought by simulation and trimming). In the device described in the U.S. patent, the bias currents have two different temperature coefficients, and the sense amplifier is biassed by a current that is proportional to absolute temperature. Furthermore, an extra conversion, provided to desensitize the output current, uses a reference tail current.

These features limit the accuracy of the logarithmic conversion obtainable by the device. Moreover, as in the European publication, the transfer characteristics are determined by the emitter degeneration resistors, which indicates the absence of any intent to use the large-signal d.c. properties of the sense amplifier bipolar devices.

SUMMARY

A logarithmic convertor according to Applicants' invention eliminates several of the drawbacks mentioned above and provides a circuit solution that is virtually insensitive to parameter dispersion and temperature variations. This eliminates the need for external temperature correction. Moreover, the logarithmic transfer function of a convertor in accordance with the invention has superior accuracy, eliminating the need for external arrangements for transfer-function-error correction. Applicants' logarithmic convertor has fewer components than prior devices, and therefore Applicants' device requires less chip area and power.

In accordance with one aspect of Applicants' invention, a logarithmic convertor has a plurality of sections electrically connected in cascade, a temperature-compensating section connected in parallel to the cascaded log sections, and an output section. Each log section comprises a constant-gain differential amplifier, means for generating a reference voltage that is substantially equal to the common-mode component of the section's electrical input signal, and a sense amplifier for generating a temperature-compensated section output signal. The temperature-compensating section comprises similar, if not identical, amplifiers and reference voltage generator.

In particular, these sections include current generators that produce currents having magnitudes that are proportional to the temperature of the logarithmic convertor and generators that produce currents having magnitudes that are constant with respect to the temperature of the convertor.

In another aspect of Applicants' invention, the constant-gain differential amplifiers and a differential amplifier in the reference voltage generators in each section and in the temperature-compensating section each include two pairs of Darlington-connected bipolar transistors. In another aspect of Applicants' invention, current generators in each section include a model of the constant-gain differential amplifier in the respective section. In yet another aspect of Applicants' invention, at least one section further includes a device for attenuating that section's electrical input signal.

BRIEF DESCRIPTION OF THE DRAWINGS

The features and advantages of Applicants' invention will be understood by reading this description in conjunction with the drawings, in which.

DETAILED DESCRIPTION

The accurate logarithmic function obtained by Applicants' invention is derived from the accurate exponential relationship between the collector current and the base-emitter voltage of a bipolar transistor. With two bipolar transistors, a differential pair is constructed, and the logarithmic behavior of this differential pair is the basis for a logarithmic amplifier, or convertor, in accordance with one aspect of Applicants' invention. It will be understood that bipolar transistors are needed only where the exponential law of the PN junction is relied on; the other transistors used, such as those in the current sources, could be suitable MOSFETS or the like. Around the differential pair, a section of the logarithmic convertor is built, and the convertor comprises a cascade of such sections. As described below, each section of the log convertor has three parts: a constant-gain differential amplifier G, a reference voltage source R, and a sense amplifier S.

Figure 1:
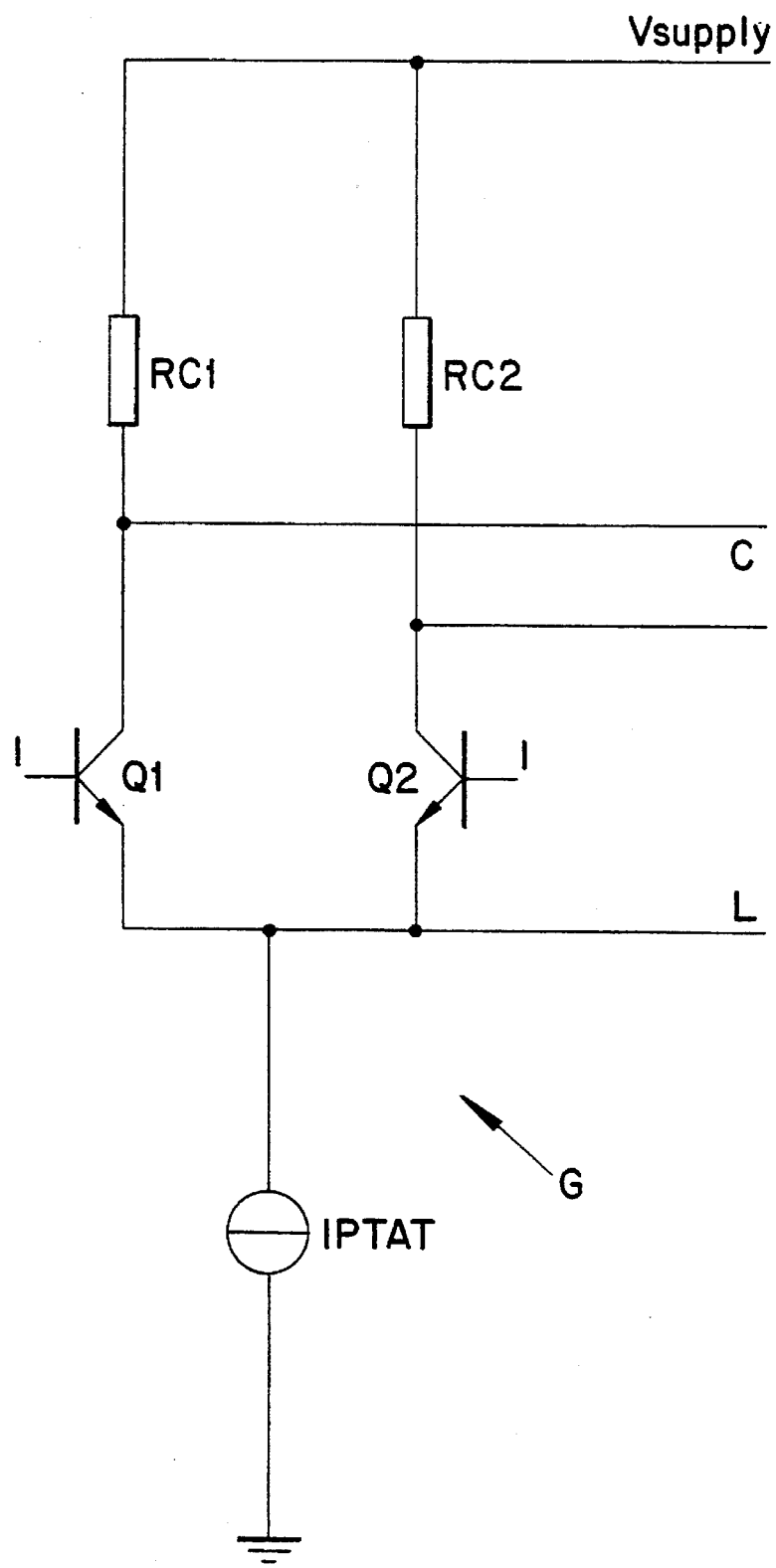
FIG. 1 is an electrical schematic diagram of a constant-gain amplifier.

Referring to FIG. 1, the constant-gain differential amplifier G includes the above-mentioned differential pair Q1, Q2 and a pair of collector resistors RC1, RC2, which are connected between the supply voltage $V_{supply}$ and the collectors of the differential pair. The amplifier G further includes a tail-current source $I_{pTAT}$, which is connected between the common emitters of the differential pair and the circuit ground. The magnitude of the current supplied by the tail-current source $I_{PTAT}$ is proportional to the circuit's absolute temperature, and is referred to below as a PTAT current. The tail-current source $I_{PTAT}$ is implemented by a model biassing technique that is described in more detail below. A differential input signal I provided to the section of the log convertor is connected to the base terminals of the differential pair Q 1, Q2. Typical values for the collector resistors RC1, RC2 are a few kilohms, and the constant-gain amplifier would have an operating current of about 0.1 milliampere.

The constant-gain differential amplifier G has three output nodes: the two collectors and the common emitters of the differential pair. The voltage formed between the collectors is the amplified differential input voltage C, which is the linear output signal of the constant-gain amplifier. The amount of amplification (i.e., the gain of the amplifier) is independent of temperature, due to the PTAT character of the tail current. The voltage formed between the common emitters and the circuit ground is the logarithmic output signal L, which comprises the common-mode input voltage, a temperature-dependent offset voltage, and a temperature-dependent logarithmic function of the differential input voltage.

It will be understood that the common-mode component, the temperature-dependent offset voltage, and the temperature dependency of the logarithmic output voltage must be eliminated. The common-mode component and the temperature-dependent offset voltage are compensated by the reference voltage source R described below. The temperature dependency of the logarithmic function of the differential input voltage has two pans: the logarithmic output voltage is proportional to the absolute temperature, and the input voltage is scaled by the absolute temperature. The output voltage's proportionality to absolute temperature is eliminated by the sense amplifier S described below. The input voltage's scaling by the absolute temperature can be compensated by a temperature-compensating section of the log convertor, which is described below.

It will be appreciated that the constant-gain amplifier G combines the functions of the separate limiting amplifier and detector that are used in log convertors such as those described in the Gilbert patent and the Fotowat-Ahmady patent and publication. Furthermore, Applicants' combining the transistors in the prior limiting amplifiers and detectors reduces the number of offset sources in Applicants' convertor, leading to increased accuracy.

Figure 2A:
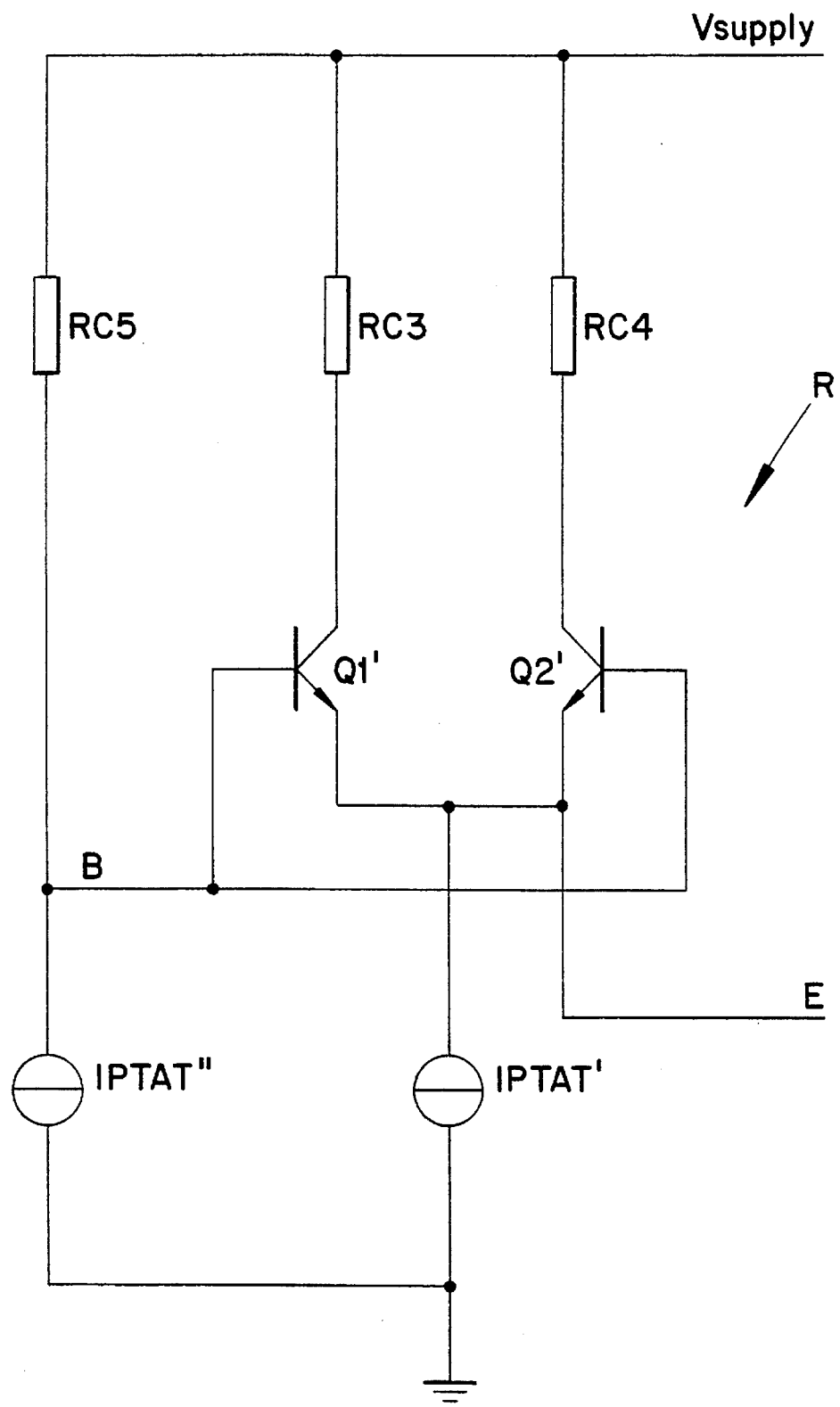
FIG. 2A is an electrical schematic diagram of a reference voltage source.
Figure 2B:
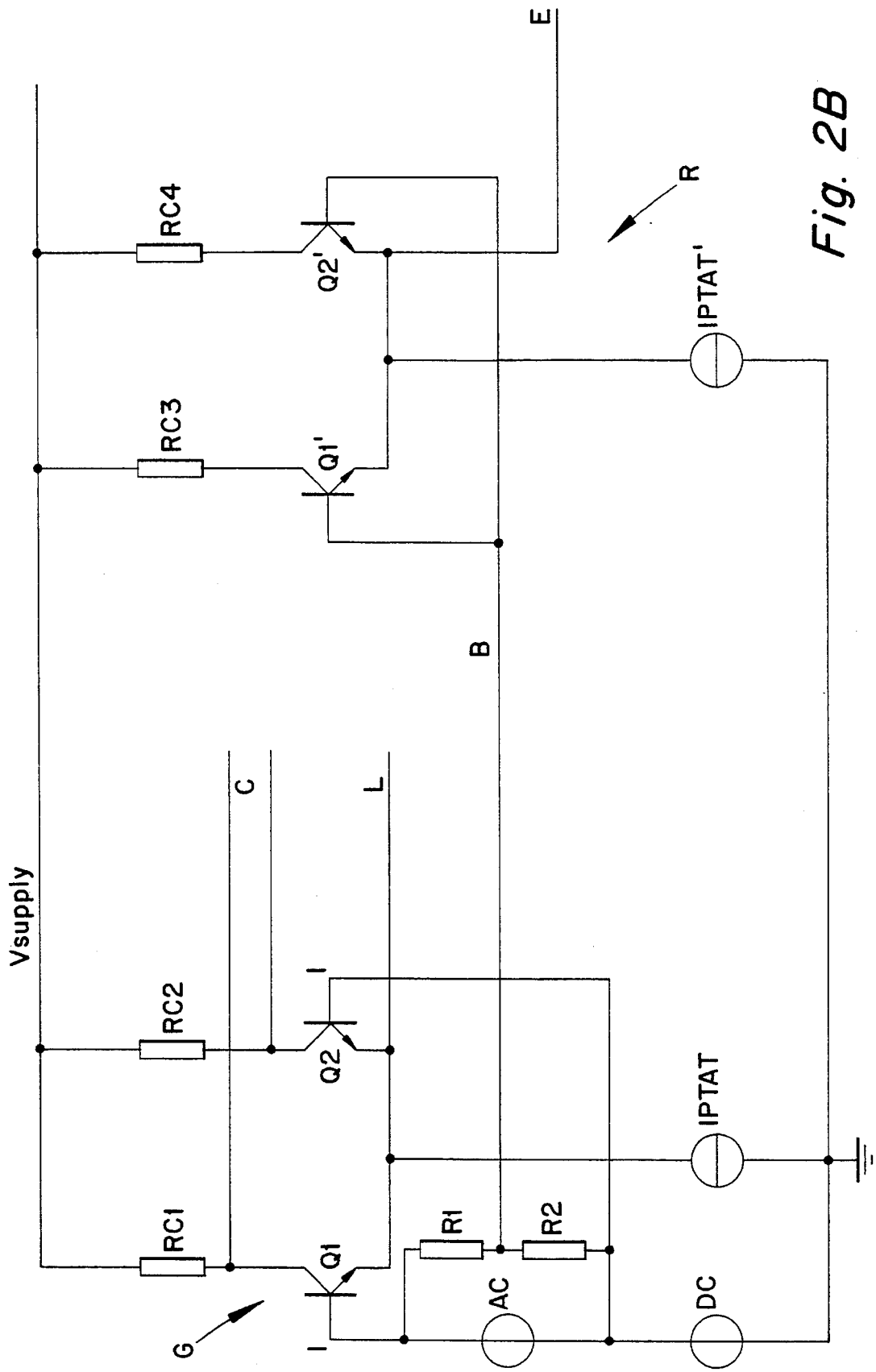
FIG. 2B is an electrical schematic diagram of a combination of a constant-gain amplifier, a reference voltage source, and a network for generating the input signal for the reference voltage source.

The reference voltage source R compensates the logarithmic output voltage of the constant-gain amplifier G for the common-mode component of the input signal. The reference voltage source R is a copy of the constant-gain amplifier G that operates under the same bias conditions to obtain the necessary compensating voltage. As seen in FIGS. 2A and 2B, the reference voltage source R includes another differential pair Q1', Q2' another pair of collector resistors RC3, RC4 and another tail-current source $I_{PTAT'}$. The magnitude of the current provided by the tail-current source $I_{PTAT}$' is again a PTAT current.

To obtain the desired compensation, the common-mode input voltage at the base terminals of the reference voltage source R's differential pair, i.e., the source R's input signal at B, must be substantially identical to the common-mode voltage presented to the constant-gain amplifier G. In the log convertor, two distinct common-mode input voltages must be considered.

For a log convertor section that is not the first section in a cascade, the common-mode input voltage to be considered is that generated by the preceding log convertor section in the cascade, i.e., the common-mode voltage generated at the collectors of the preceding constant-gain amplifier. This common-mode voltage can conveniently be generated by a network comprising a third resistor RC5 and another PTAT current source $I_{PTAT}''$ as illustrated in FIG. 2A.

For a log convertor section that is connected to the input signal to the log convertor, e.g., the first log convertor section in a cascade, the common-mode input voltage to be considered is that generated by the source of the input signal. In general, this voltage is different from the common-mode voltages in the other log convertor sections, containing a d.c. component and, if the input signal is unbalanced, an a.c. component due to the input signal. (When the log convertor section is driven by a balanced input signal I, the common-mode a.c. part of the input voltage level is zero, and the voltage at B is also zero.) The d.c. component can simply be derived from the input signal source, and the a.c. component for a fully unbalanced (single-sided) signal is one-half of the input signal value. FIG. 2B shows a combination of a constant-gain amplifier G and reference voltage source R and a network for generating the input for the reference voltage source. As seen in FIG. 2B, the a.c. component of the common-mode input voltage is developed by the resistive divider formed by the two identical resistors R1, R2.

In the reference voltage source R, the voltages at the collectors of the differential pair are not used as output signals. The voltage signal E between the common emitters of the differential pair and ground is the output signal of the voltage source R. The output signal E is used in compensating the common-mode component in the logarithmic output signal L of the constant-gain amplifier G.

As noted above, the sense amplifier S performs two functions in generating the logarithmic output current for the log convertor section: it compensates the common-mode component, and it temperature compensates the input signal. In accordance with Applicants' invention, the sense amplifier has a non-linear d.c. transfer characteristic that is based on the accurately known exponential law of the PN junction. Applicants' combination of the non-linear d.c. transfer characteristics of the sense amplifier S and the constant-gain amplifier G, which is also based on the exponential law of the PN junction, results in an approximation of a logarithmic function that is more accurate than prior devices, provided the amplifiers' bias currents have the proper temperature coefficients.

In accordance with one aspect of Applicants' invention, these temperature coefficients are determined by indirect feedback techniques rather than trimming or metering. In this way, systematic construction errors are eliminated, leaving only circuit component mis-matches as an error source for the temperature coefficients and greatly enhancing the designability of the log convertor. Moreover, in contrast to prior convertors that have separate detectors, Applicants' sense amplifiers do not load the forward signal path, and thus Applicants' log convertor can dispense with emitter-follower buffers or other means for compensating such loading.

Figure 3:
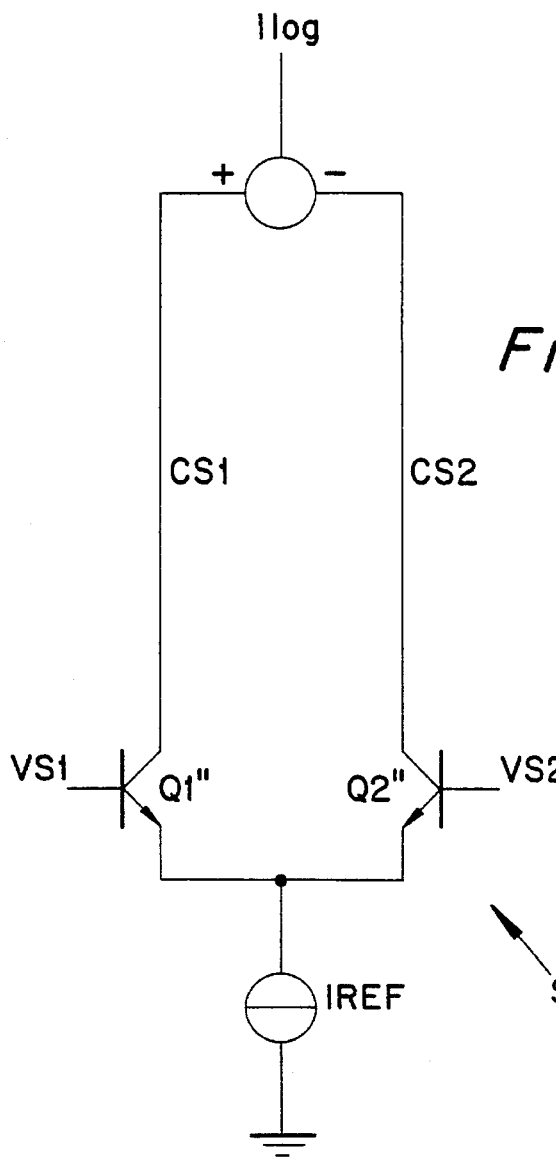
FIG. 3 is an electrical schematic diagram of a sense amplifier.
Figure 4:
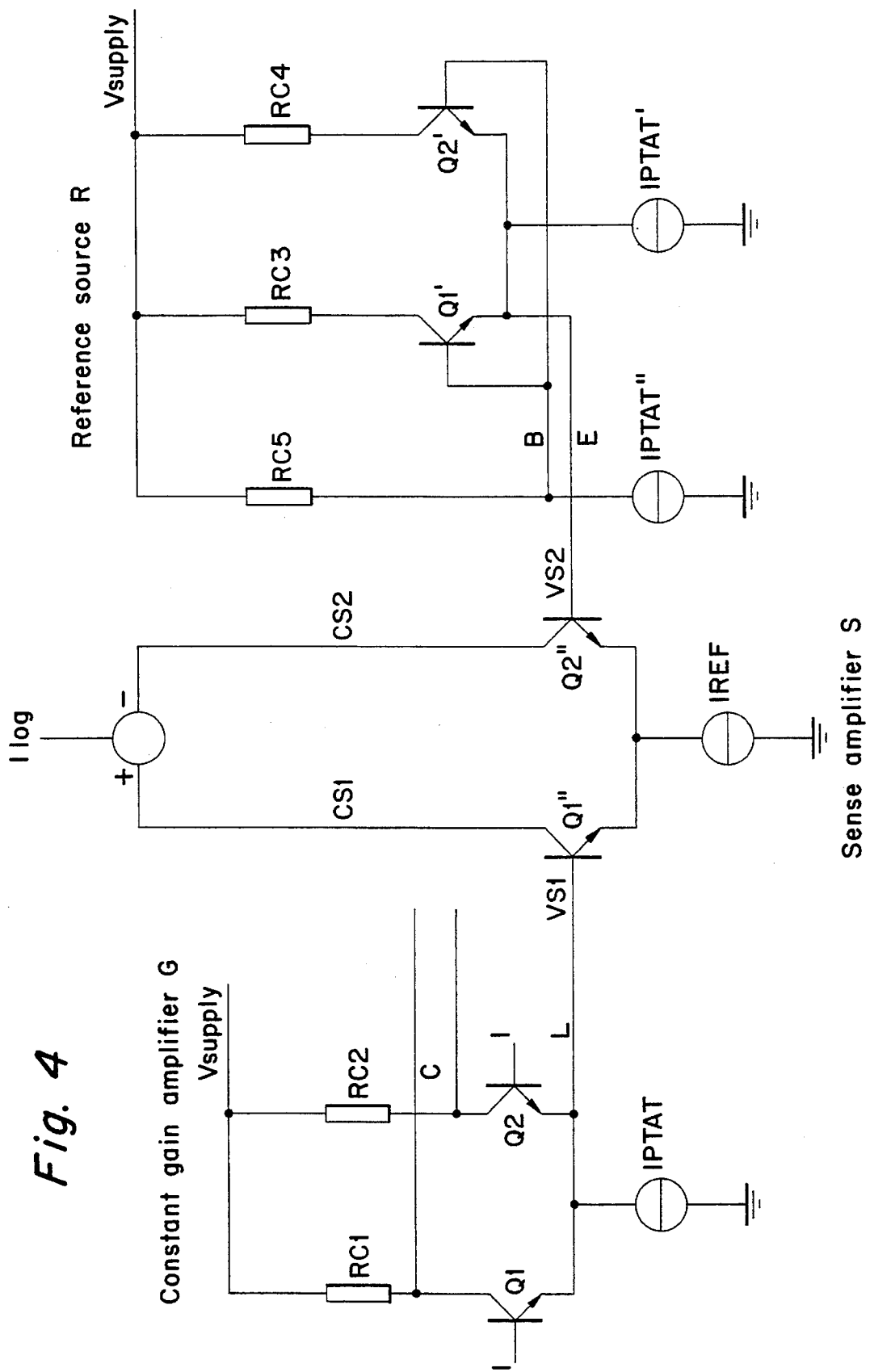
FIG. 4 illustrates a logarithmic amplifier section.

Referring to FIG. 3, the sense amplifier S includes yet another differential pair Q1", Q2" and a tail-current source $I_{ref}$ connected between their common emitters and the circuit ground. In one currently preferred embodiment, the sense amplifier S would have an operating current of about ten microamperes. The sense amplifier's differential output signal $I_{log}$ is related to the difference between the voltages at the collectors CS1, CS2 of the differential pair Q1", Q2". In general, no special network is needed for convening the differential voltage to the current $I_{log}$; it is sufficient that the current $I_{log}$ is the current produced by the effective voltage source formed by the collectors of the sense amplifier differential pair. The input signals presented to the sense amplifier's differential pair are the voltages VS1, VS2 at the respective bases of the transistors Q1", Q2". As seen in FIG. 4, the input signal VS1 is the logarithmic output signal L of the constant-gain amplifier G and the input signal VS2 is the output signal E of the reference voltage source R.

As a result of this arrangement, the common-mode component in the input signal I is eliminated and the differential input signal at the sense amplifier input terminals (the bases of the sense amplifier's transistors Q1", Q2") is a logarithmic function of the differential input signal I to the constant-gain amplifier.

The voltage VS1 is given by the following expression:

$$V_{vs1} = V_{common} + V_{th} + V_T \log(2) + V_T \log\left(\cosh\left(\frac{V_{bb}}{2V_T}\right)\right)$$

where $V_{common}$ is the common-mode voltage presented to the base terminals of the differential pair in the constant-gain amplifier G (viz., the common-mode component of the input signal I); $V_{th}$ is a temperature-dependent offset introduced by the constant-gain amplifier G; $V_T$ is a thermal voltage that is PTAT; and $V_{bb}$ is the differential voltage presented to the base terminals of the differential amplifier in the constant-gain amplifier (viz., the differential component of the input signal I).

The voltage VS2, i.e., the output signal from the reference voltage source R, is given by the following expression:

$$V_{VS2} = V_{commonref} V_{thref} + V_T \log(2)$$

where $V_{commonref}$ is the common-mode input voltage at B presented to the reference voltage source R; and $V_{thref}$ is a temperature-dependent offset caused by the reference voltage source R.

Within a predictable operating range of several $V_T$, the voltage VS1 can be approximated by a pure logarithmic function of the voltage $V_{bb}$. For example, the voltage VS1 is approximately given by the following expression:

$$V_{vs1} \approx V_{common} + V_{th} + V_T \log(2) + kV_T \log\left(\frac{V_{bb}}{2V_T}\right)$$

where k has a value of about 2.7. It will be appreciated that the factor k expresses the effect of the cosh function in the argument of the logarithm in the exact expression for the voltage VS1 given above.

Accordingly, the differential signal VS1−VS2, at least within the operating range of the log convertor section, is given by the following approximate expression:

$$VS1 - VS2 = V_{log} \approx kV_T \log\left(\frac{V_{bb}}{2V_T}\right)$$

because corresponding terms in the approximate expressions for VS1 and VS2 cancel.

From the preceding expression, it can be seen that the differential input voltage $V_{bb}$ to the log convertor section is scaled by an offset voltage $2V_T$, and the logarithmic function is proportional to the thermal voltage $V_T$. This proportionality is corrected by the sense amplifier S, and the sense amplifier's tail current source $I_{ref}$ is arranged to be independent of temperature. The log convertor section's output signal is obtained by eliminating the common-mode component in the currents from the collectors of Q1", Q2" in the sense amplifier. Thus, the logarithmic information is contained in the differential component of the collector currents of the sense amplifier. The differential output current $I_{log}$ of the sense amplifier is given by the following expression:

$$I_{log} = I_{ref} \tanh\left(\frac{1}{2} \log\left(\cosh\left(\frac{V_{bb}}{2V_T}\right)\right)\right)$$

where $I_{ref}$ is the tail current produced by the tail current source $I_{ref}$ in the sense amplifier; $V_{bb}$ is the differential input voltage to the logarithmic convertor section, viz., the differential component of the input signal I; and $V_T$ is the thermal voltage.

It will be seen that the output current $I_{log}$ is not proportional to the thermal voltage $V_T$ as a result of the temperature compensation in the sense amplifier, but the differential input voltage $V_{bb}$ is still scaled by $V_T$. This temperature dependency can be eliminated by considering two cases: where $V_{bb}$ is PTAT, and where $V_{bb}$ is independent of temperature.

In the first case, the temperature dependency of the input signal is directly canceled by the divisor $2V_T$ in the argument of the logarithm in the preceding expression. It will be noted that the magnitude of the differential input voltage $V_{bb}$ is PTAT when it is the output signal produced by another log convertor section, such as a preceding section in a cascade. For this case, the log convertor section is a combination of the constant-gain amplifier G, the reference voltage source R, and the sense amplifier S as shown in FIG. 4.

In the second case when the differential input signal $V_{bb}$ comes from an independent signal source, the divisor $2V_T$ no longer cancels the input signal's temperature dependency, and the unwanted temperature dependency in the output current $I_{log}$ remains. This unwanted temperature dependency can be canceled by combining the log convertor section's output current $I_{log}$ with an output current $I_{TC}$ generated by a temperature-compensating section 30 such as that shown in FIG. 5.

The temperature-compensating section includes a constant-gain amplifier GT, a reference voltage source RT, and a sense amplifier ST, just as the log convertor section does. Indeed, the reference voltage sources R and RT are identical. On the other hand, the constant-gain amplifier GT in the temperature-compensating section includes a temperature-independent input voltage $V_{offs}$ connected as the input signal to the differential pair Q1, Q2. $V_{offs}$ is a reference voltage within the operating range of a log convertor section and is approximately $2V_T$ at room temperature. As described below, the voltage $V_{offs}$ may be generated by any of several types of precision voltage source, and its magnitude is selected such that the d.c. operating conditions of the constant-gain amplifier GT match the d.c. Operating conditions of the constant-gain amplifier G to which the external input signal is connected. Also, the output of the differential pair in the sense amplifier ST has a sense opposite to the output of the differential pair in the sense amplifier S as indicated by the polarity of the output voltage source in FIG. 5. In this way, the input voltage $V_{offs}$ produces an output current $I_{TC}$ that depends on temperature, and this temperature dependency is used to cancel the temperature dependency of $V_{bb}$ in $I_{log}$ when $I_{TC}$ is subtracted from $I_{log}$.

Figure 5:
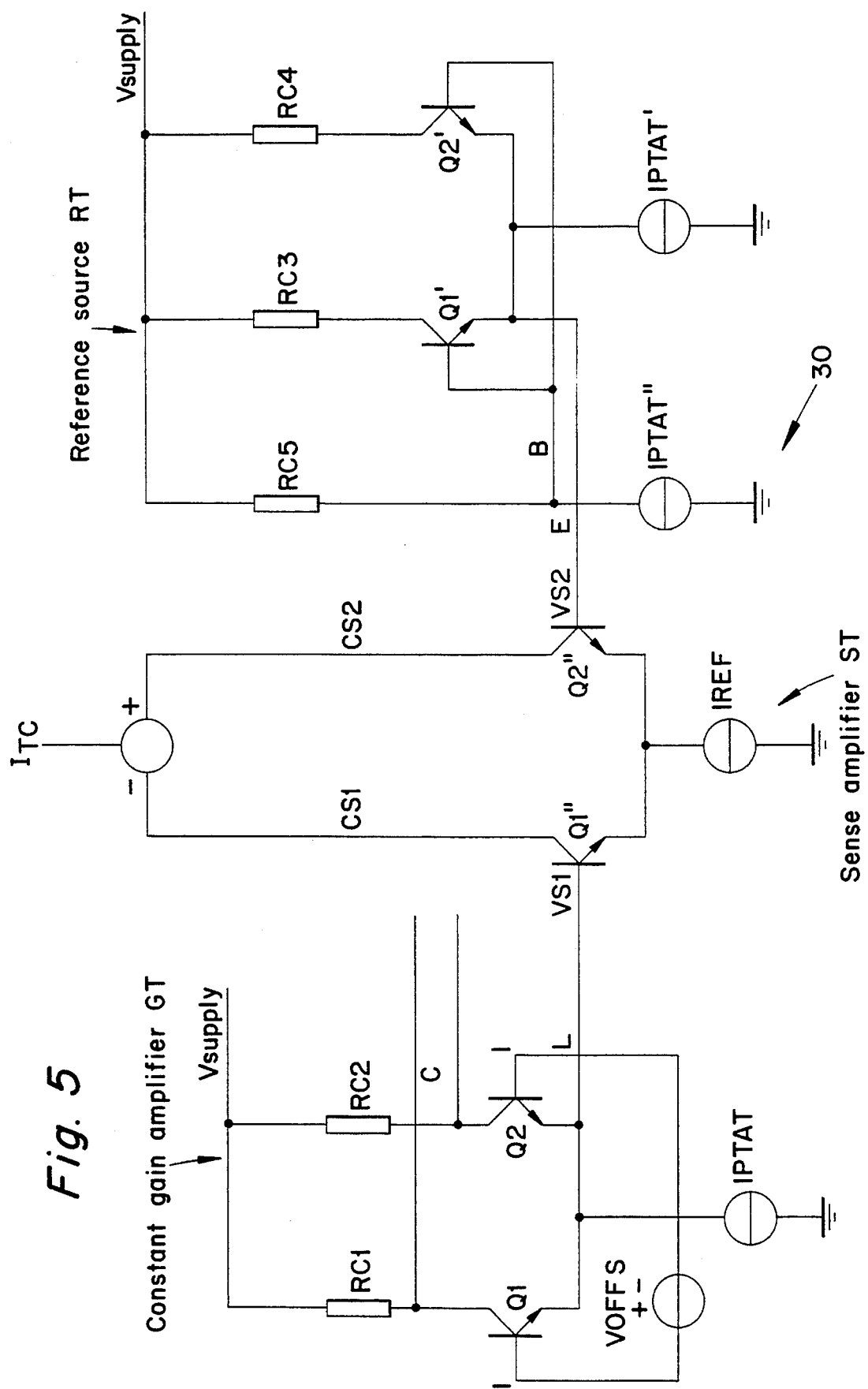
FIG. 5 illustrates a temperature-compensating section.

The log convertor section shown in FIG. 4 and the combination of the sections shown in FIGS. 4 and 5 produce differential output currents that are accurate, temperature-independent logarithmic functions of the differential input voltages presented to their constant-gain amplifiers. In addition, the gains of the sense amplifiers decrease as the differential input signal increases (due to the hyperbolic tangent in the preceding expression), and this behavior improves the accuracy of the logarithmic function obtained by the constant-gain amplifiers. A log convertor section, as shown in FIG. 4, is a combination of a constant-gain amplifier G (FIG. 1), a reference voltage source R (FIG. 2A or FIG. 2B), and a sense amplifier S (FIG. 3).

Figure 6:
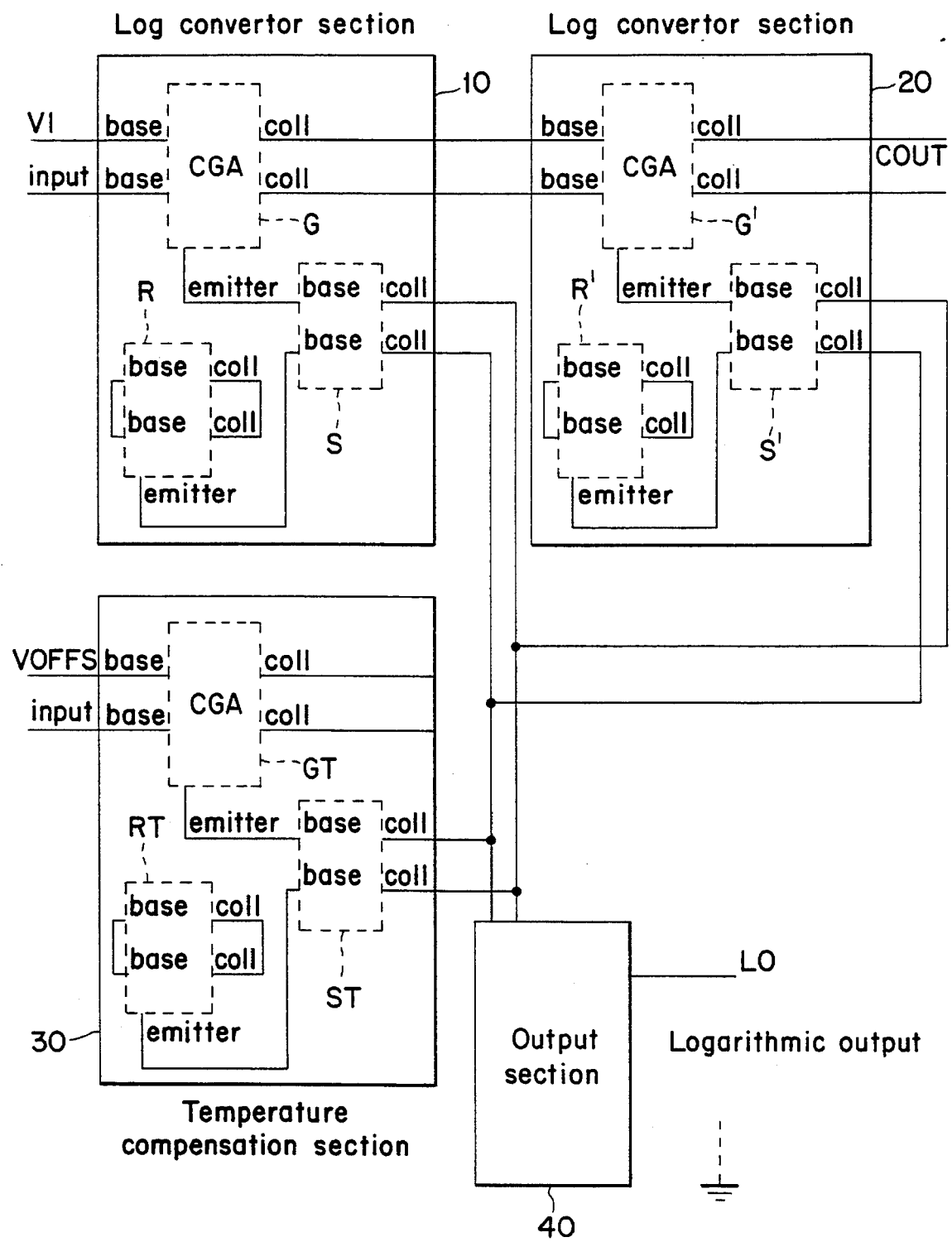
FIG. 6 is a block diagram of a logarithmic amplifier including a cascade of logarithmic amplifier sections, a temperature-compensating section, and an output section.

The logarithmic relationship obtained by a section such as that illustrated in FIG. 4 is only valid over a limited range of input voltages. Thus, as described above, several log convertor sections are cascaded to extend the operating range. As illustrated in FIG. 6, the cascade is constructed by connecting the linear output C (the collectors) of the constant-gain amplifier G of a first log convertor section 10 to the differential inputs (the bases) of the constant-gain amplifier G' of a succeeding log convertor section 20. Also, the collectors of the sense amplifiers S' in the log convertor sections 10, 20 in the cascade are connected together for summing their log output currents. The logarithmic output current of the cascade is the summed differential current of the individual sense amplifiers in each logarithmic section. It will be appreciated that only two log convertor sections are illustrated in FIG. 6, although in principle any number of sections could be connected in the cascade.

Only one temperature-compensating section 30 is needed to compensate for the thermal voltage $V_T$ in the preceding approximate expression for $V_{log}$, no matter how many log convertor sections are in cascade. The $V_T$ term can instead be canceled by making the input voltage $V_{bb}$ a PTAT voltage, as noted above and as is done in the Gilbert patent. Another way to cancel the $V_T$ term is by adding a logarithmic current generated from a voltage $V_{offs}$ as described above. This logarithmic current can be generated from the logarithmic voltage $V_{TC}$ generated by a single temperature-compensating section that is given by the following expression:

$$V_{TC} \approx kV_T \log\left(\frac{V_{offs}}{2V_T}\right)$$

Subtraction of $V_{TC}$ from $V_{log}$ shows that the $V_T$ term cancels. Since the expressions for these voltages are only approximations, a small temperature dependency will remain in the exact expression for $I_{log}$.

All of these sections are preferably integrated on a single semiconductor chip, although at least in principle the sections could be constructed from discrete components. Integration, of course, permits close matching of the components of the sections of the convertor. Moreover it will be understood that the various current sources described in this application, such as $I_{PTAT}$ and $I_{tail}$ are conveniently implemented by transistor-emitter-resistor combinations. The voltage sources described in this application, such as $V_{offs}$ and $V_{REF}$, can be provided by precision sources that are external to an integrated log convertor, but any of the well know techniques for building integrated precision voltage sources can be used to integrate the voltage sources and log convertor.

The accuracy of the logarithmic function achieved by Applicants' convertor depends on the small-signal gain of each log convertor section in a manner that is fundamentally different from the dependency of previous devices such as that described in the Gilbert patent. In Applicants' convertor, an optimal value of the gain is currently believed to be about 12 dB per section. In a cascade of sections, the operating range of the log convertor is expanded by about 12 dB for every added section. At the limits of the operating range, the log convertor error rapidly increases but within the operating range, one can distinguish three modes of operation for each section in the cascade. If the input signal is small enough, the first section will operate linearly. Then, the input level to each section will increase per section proceeding through the cascade up to a point where sections start saturating. One section in the cascade will neither operate linearly nor saturate; this is the active log convertor section that is responsible for the logarithmic output signal. Of course, crossover between successive sections will occur as the input level to the cascade increases, and this crossover causes a ripple, i.e., an error, in the logarithmic output-vs.-input function.

Thus, the accuracy of the log function is basically determined by the large-signal d.c. transfer characteristic of the constant-gain amplifier and the sense amplifier, which is entirely determined by the exponential law of the PN junction. In a cascade of log convertor sections, the composite error within the operating range is limited to about ±0.15 dB for sections having 12 dB gain. The sense amplifier S has a beneficial effect on this error. To obtain the same basic accuracy from many prior log convertors that use straight-line approximation, such as that described in the Gilbert patent, the gain of each stage would have to be so low that an impractically large number of stages would be needed.

Using well known techniques, the logarithmic output current of Applicants' cascade is convened to an output voltage signal LO by an output section 40 illustrated in FIG. 6. The output section 40 performs two functions: it combines or otherwise interfaces with the output currents from the collectors of the sense amplifiers to produce the current $I_{log}$; and it converts the current $I_{log}$ to a voltage. Although particular examples of the output section are described below, it will be understood that the designs can be adapted according to the circuitry that follows the output section.

The sense amplifier collectors might be connected to a current mirror that eliminates the common-mode component in the logarithmic output current, thereby producing a differential current as measured between the output of the current mirror and circuit ground. This differential current might then be converted by the output section to a desired output quantity, e.g., a lowpass-filtered voltage, by a resistor and a filter. Filtering is often used to eliminate high-frequency components due to leakage of the radio carrier into the input signal to the logarithmic convertor.

It will be appreciated that using a current mirror and a resistor for converting the logarithmic output current to a voltage as described above has drawbacks. Using a current mirror connected to the outputs (the collectors) of the sense amplifiers for summing the collector currents has the advantage of subtracting the currents as necessary so that the minimum of the sum is zero. On the other hand, current mirrors are usually temperature dependent. Using a resistor for converting current to voltage requires sourcing the resistor with a current source and loading the resistor with a very high impedance.

Figure 7:
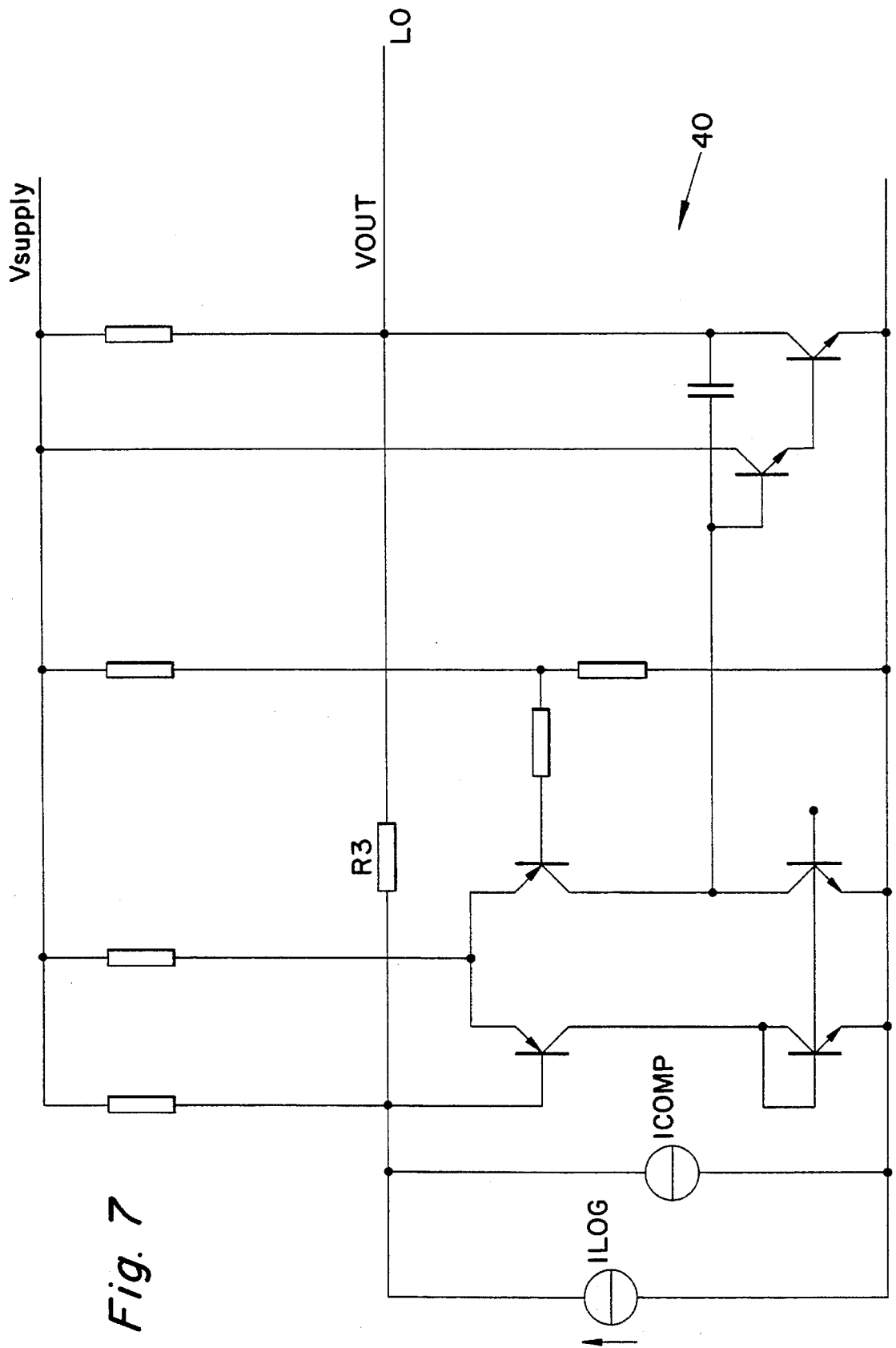
FIG. 7 is an electrical schematic diagram of an output section.

As another alternative, the output section 40 can produce the current $I_{log}$ simply by taking the currents at one of the collectors of each sense amplifier. (The other collectors would then be connected to $V_{supply}$.) It would then be necessary to compensate (subtract) the offset due to taking only half the signal without introducing a temperature dependency. Such an arrangement is currently preferred. A suitable output section 40 that avoids a current mirror and includes a network for current-to-voltage conversion is depicted in FIG. 7. The output section includes a d.c. current source $I_{comp}$ for canceling the d.c. offset component of $I_{log}$ due to taking the currents from only half of the sense amplifier collectors. It will be understood that a comparable d.c. current source is included in the output section model described below in connection with FIG. 10, and thus introduction of a temperature is avoided.

FIG. 7 illustrates a suitable output section 40, although it will be appreciated that other circuit designs are suitable if they are based on at least the following considerations. First, the temperature dependency of the output section 40 should be made as small as reasonably possible. Second, the temperature dependency of the output section's transfer characteristic from input current signal $I_{log}$ to output voltage signal LO must match the temperature dependency of the transfer characteristic of the model of the output section that is described below in connection with model feedback. The better the match is, the smaller the remaining temperature dependency is, due to the model feedback. The closeness of the matching depends on the semiconductor fabrication processes used in making the convertor, but it also depends on the number of temperature coefficients that must match, i.e., the number of relevant circuit components. In converting the current $I_{log}$ to a voltage, at least one resistor is needed, and that resistor (indicated by R3 in FIG. 7 will generally have a process-dependent temperature coefficient. Also, as described below, the model biassing technique needs a loop amplifier having a sufficiently small offset drift with temperature.

Figure 8:
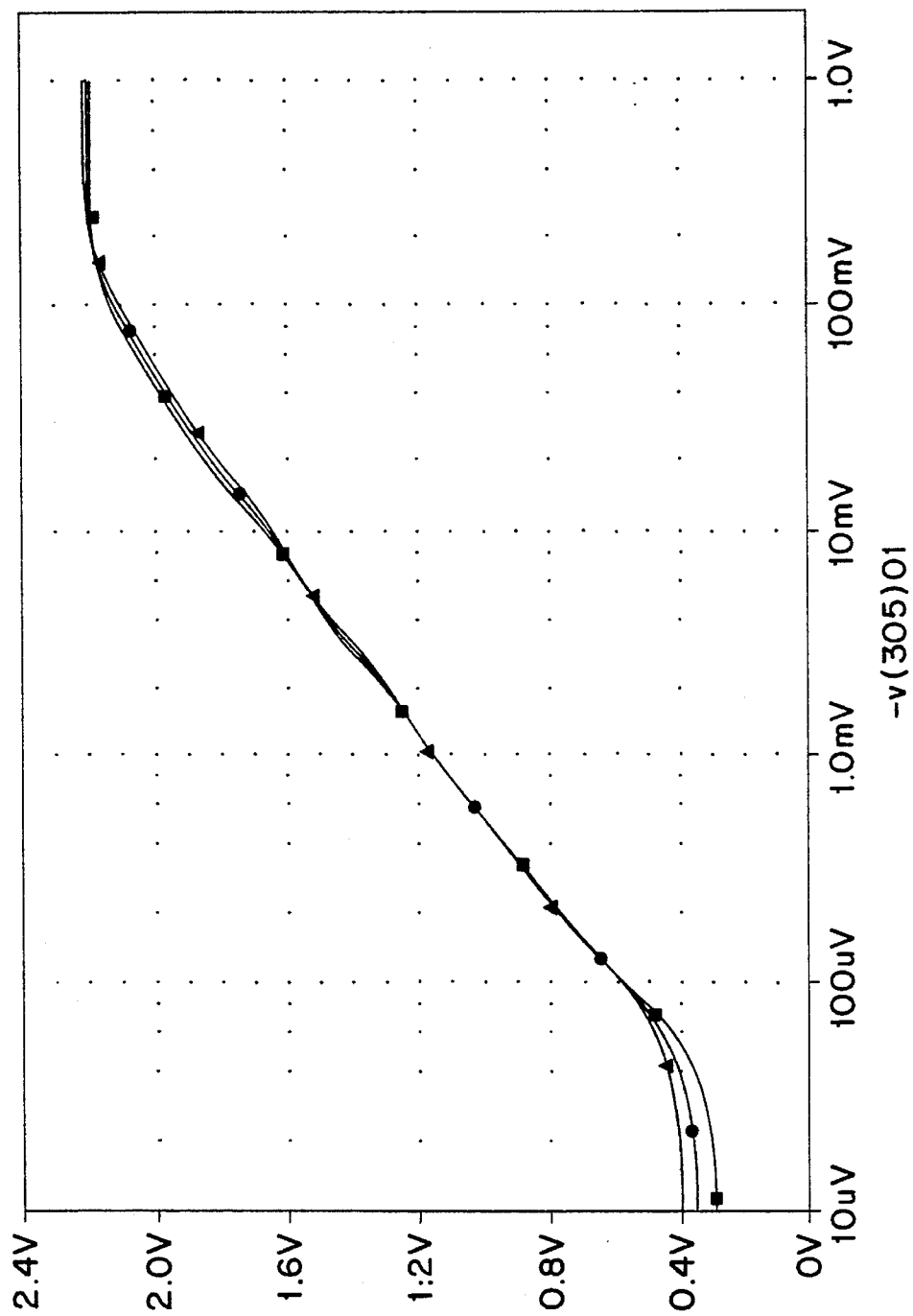
FIG. 8 is a plot of the response at various temperatures of a logarithmic amplifier comprising a cascade of log amplifier sections.

Using Applicants' invention, a log convertor having a very stable and accurate logarithmic transfer function can be built. FIG. 8 shows the transfer function of such a log convertor on a semilog scale for three temperatures, −30° C., 27° C., and 85° C. The input voltage to the log convertor is shown on the logarithmic X-axis, and the convertor's output voltage signal LO is shown on the linear Y-axis. For input voltages between about 100 microvolts and about 100 millivolts, the log convertor's output voltage LO accurately ranged between about 0.6 volt and about 2.1 volts for all three temperatures.

The insensitivity with respect to temperature of Applicants' log convertor has three main causes: the tail currents of the constant-gain amplifiers G are accurately PTAT so that the gains are independent of temperature; the tail currents of the sense amplifiers S are independent of temperature; and the output section converts the differential logarithmic output current $I_{log}$ produced by the sense amplifiers to the output voltage signal LO in a temperature-independent fashion. Any deviation from these requirements introduces temperature errors.

In accordance with Applicants' invention, deviations from the three requirements are compensated through a model biassing technique in which the necessary bias condition is reproduced in a model of the circuit part actually used for logarithmic conversion. The circuit part model is embedded in a feedback loop that forces the required operating condition on the circuit part model, and the bias conditions in the model are copied into the actual circuit part. This technique as applied to the constant-gain amplifiers, the sense amplifiers, and the output section is described in more detail below.

Model Biassing in the Constant-Gain Amplifiers

Figure 9:
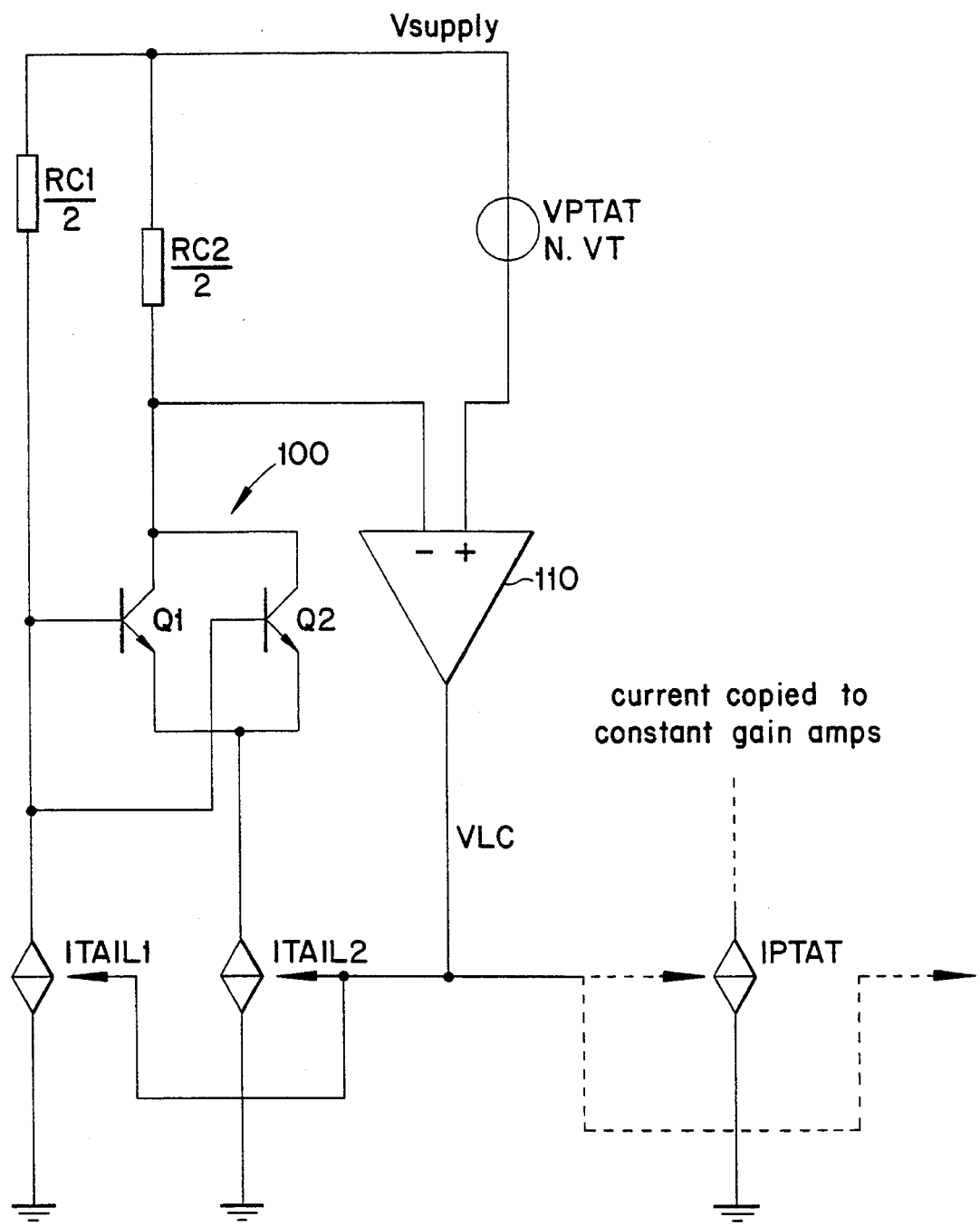
FIG. 9 is an electrical schematic diagram of a model for biassing a constant-gain amplifier.

The model biassing technique is applied to create an exact model of the constant-gain amplifier G, including load and source impedances, that processes the input signal I. This model amplifier is embedded in a feedback loop that forces a PTAT voltage on the model's collector resistors RC1, RC2 which results in a gain that is constant with respect to temperature. Referring to FIG. 9, the loop includes the model of the constant-gain amplifier, comprising a differential pair 100 of bipolar transistors Q1, Q2; a combined collector resistor RC1/2 having a resistance value that is one-half of the resistance values of the collector resistors RC1, RC2 in the amplifier G; a differential pair input generator network comprising another resistor RC2/2 and current generator $I_{TAIL1}$, $I_{TAIL2}$ and an additional loop amplifier 110, which may be an operational amplifier.

One important characteristic of the loop amplifier 110 is its offset drift with temperature. The loop amplifier should have an offset voltage drift that is preferably PTAT because this offset is in series with the input voltage, which is PTAT. Any deviation in the temperature coefficient of the offset drift from PTAT causes a temperature coefficient in the gain of the constant-gain amplifier. It will also be understood that the amplifier should have appropriate gain and stability, as usual.

The input signal to the loop amplifier 110 is presented at the two terminals VC. Connected to the negative input terminal is the voltage to be controlled, i.e., the common-mode voltage at the two collectors of the model's differential pair 100. Connected to the positive input terminal of the loop amplifier is a PTAT voltage source $V_{PTAT}$ that provides a reference voltage having a magnitude proportional to the thermal voltage $V_T$. As seen in FIG. 9, the voltage source $V_{PTAT}$ is connected between the supply voltage rail and the loop amplifier's positive input terminal.

The output signal VLC generated by the loop amplifier 110 controls the tail current sources $I_{TAIL1}$, $I_{TAIL2}$ of the model amplifier. As the loop amplifier 110 nulls its differential input signal, the model amplifier's tail current takes on the required temperature dependency, and the gain of the model amplifier becomes independent of temperature. It will be appreciated that the temperature dependencies of the resistors in the model amplifier are also eliminated by the model biassing loop. The model amplifier's tail current is copied into current sources $I_{PTAT}$ in the actual constant-gain amplifiers G used in the log convertor using well known mirroring techniques.

It will be appreciated that a base rail voltage is provided in the model feedback loop that precisely sets the tail current of the gain pair 100 to the desired value. All systematic errors in the bias point set by the model bias are therefore reliably eliminated, unlike prior devices in which systematic errors must be accounted for explicitly.

Model Biassing in the Sense Amplifiers and Output Section

Figure 10:
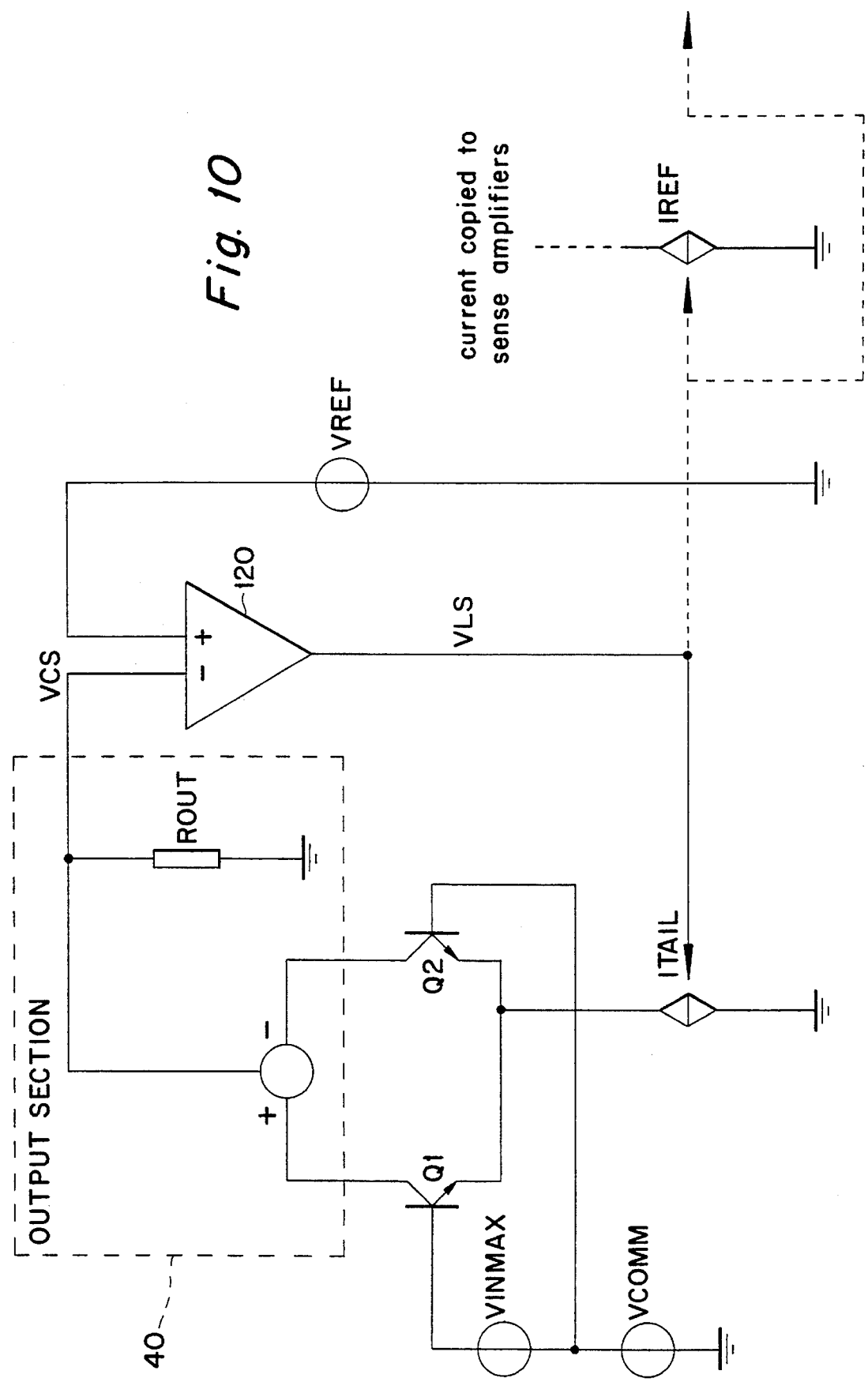
FIG. 10 illustrates a model for biassing a sense amplifier and an output section.

The model biassing technique is also applied to a scaled model of the sense amplifiers S and the output section 40. Referring to FIG. 10, the differential input signal to the input VINMAX of a model sense amplifier corresponds to the maximum signal value obtainable from the constant-gain amplifiers. The common-mode input signal level VCOMM presented to the scaled model sense amplifier is equal to the level observed in the actual circuit.

The negative input terminal of the loop amplifier 120 is connected to the output voltage LO of a model output section, indicated in FIG. 10 by a source and resistance ROUT, and thereby to the output current of a differential pair of bipolar transistors Q1", Q2". The differential pair act as a model of the sense amplifier S. Under the aforementioned operating conditions, the signal level at the output of the model (the collectors of the differential pair) is at its maximum value, corresponding to a point on the logarithmic output curve of the log convertor. The voltage level at that point is forced to be equal to a reference voltage $V_{REF}$, which is connected to the positive input terminal of the feedback loop amplifier 120 and which is independent of temperature.

The output signal VLS generated by the loop amplifier controls the tail current generated by the source $I_{TAIL3}$ in the model sense amplifier, and as a result this tail current takes on the proper temperature dependency. Also, the maximum output voltage of the logarithmic convertor output section becomes independent of temperature, and thus temperature errors due to unwanted temperature behavior of the sense amplifier and the output section are eliminated at the maximum output level of the circuit model. To obtain the same behavior in the actual circuit, the model's tail current is copied into the current sources $I_{REF}$ in the actual sense amplifiers in the log convertor using well known mirroring techniques.

One important result of this model biassing technique is that the output level of the logarithmic convertor is accurate and temperature-independent. Temperature dependencies of resistors are eliminated by the model biassing loop. Also, the loop effectively increases the operating temperature range of the circuit at given accuracy requirements.

Gain Accuracy Improvement with Darlington Differential Pairs

The gain of a constant-gain amplifier G such as that illustrated in FIG. 1 may include an error due to the load impedance formed by the next section in a cascade of sections such as that illustrated in FIG. 6. As seen in FIG. 6, the load impedance presented by the section 20 is effectively connected in parallel with the collector resistors of the constant-gain amplifier G in the section 10.

Figure 11:
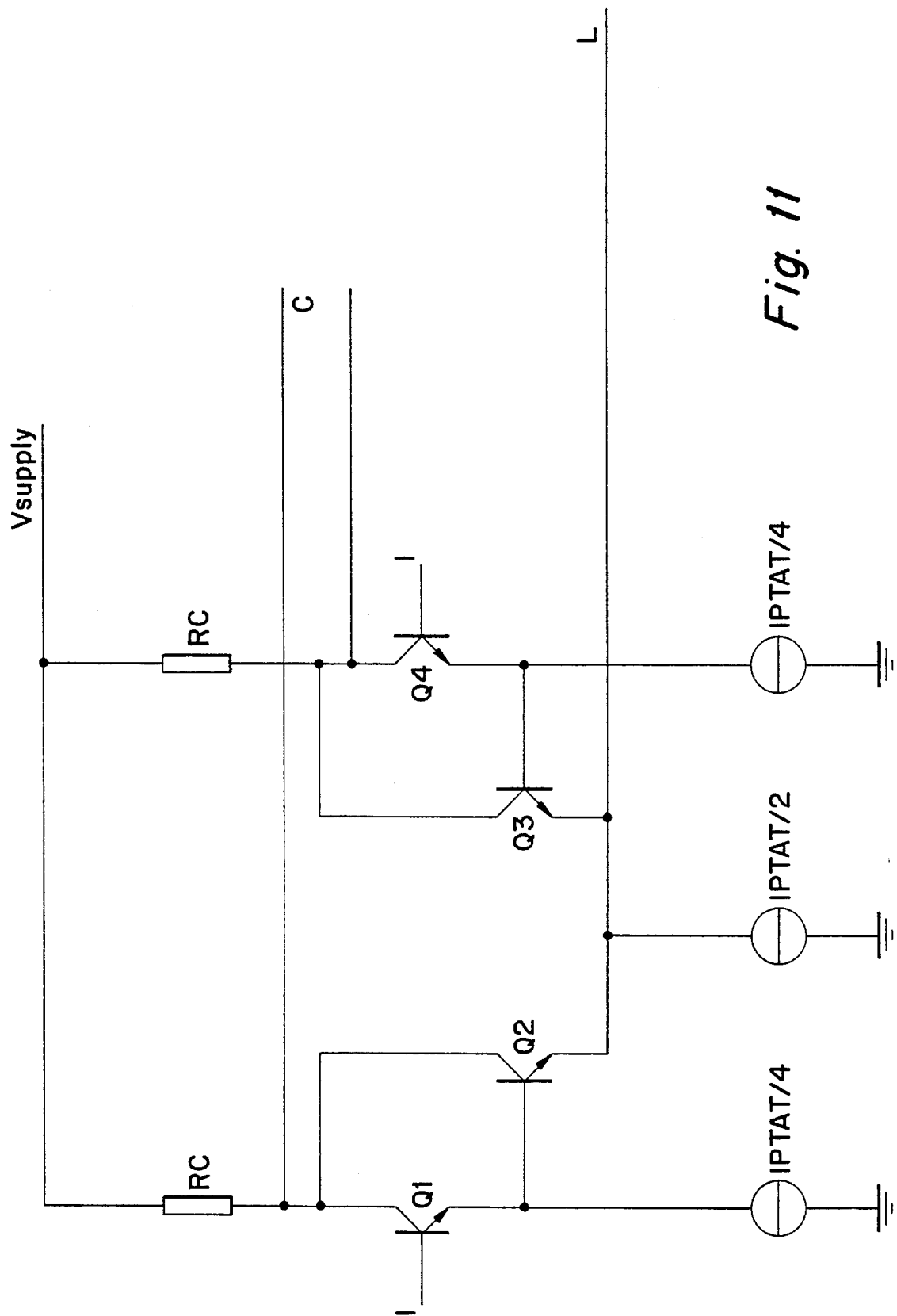
FIG. 11 illustrates a Darlington-connected, constant-gain amplifier.

The effect of the load impedance on the gain can be decreased by using a differential Darlington pair Q3, Q4 and Q5, Q6 instead of an ordinary differential pair in the constant-gain amplifier G as illustrated in FIG. 11. If Darlington pairs are used in the constant-gain amplifier, a differential Darlington pair should also be used in the same way instead of the ordinary differential pair in the reference voltage source R.

It will be understood that Darlington pairs are used to reduce a.c. loading, and since the highest impedance is found at the collector resistors RC1, RC2 of the constant-gain amplifiers, using them there is appropriate. Darlington pairs could be used in the sense amplifiers, too, but the a.c. loading by the sense amplifiers can be reduced sufficiently simply by setting the magnitude of the tail current source $I_{ref}$ to a value much smaller than the value of the constant-gain amplifier's tail current source $I_{PTAT}$. This has the advantage of avoiding an extra offset that would be introduced by the Darlington pairs.

As for the temperature-compensating section, a.c. loading is not an issue, and thus Darlington pairs are not needed for that purpose. Nevertheless, it is important to note with respect to the d.c. behavior that the temperature-compensating section is there to compensate for the temperature coefficient of the first log convertor section. Therefore, if Darlington pairs are used in the first log convertor section, such pairs must be used in corresponding places in the temperature-compensating section because the structures of the temperature-compensating section and the first log convertor section must match. Similar reasoning explains the use of Darlington pairs in the reference voltage source R, as noted above.

Referring to FIG. 11, the amplifier's logarithmic output voltage and the linear differential output voltage are found at terminals L and C, respectively, and these terminals correspond to the L and C terminals of the unmodified constant-gain amplifier (FIG. 1). Also, it can be seen that the single tail-current source $I_{PTAT}$ of the unmodified amplifier G is simply replaced by three PTAT current sources that are connected and supply currents having the magnitudes as shown in FIG. 11. It will be noted that the total current supplied by the three PTAT tail-current sources is just the current supplied by the single PTAT tail-current source in the unmodified amplifier.

Input Range Improvement

The maximum differential input voltage level of a log convertor in accordance with Applicants' invention is limited by the thermal voltage $V_T$, and the minimum input level is limited by offset voltages in the circuit. As described in more detail below, the first limitation can be eliminated by using one or more attenuating log convertor sections, and the second limitation can be eliminated by using a d.c. feedback loop.

Figure 12:
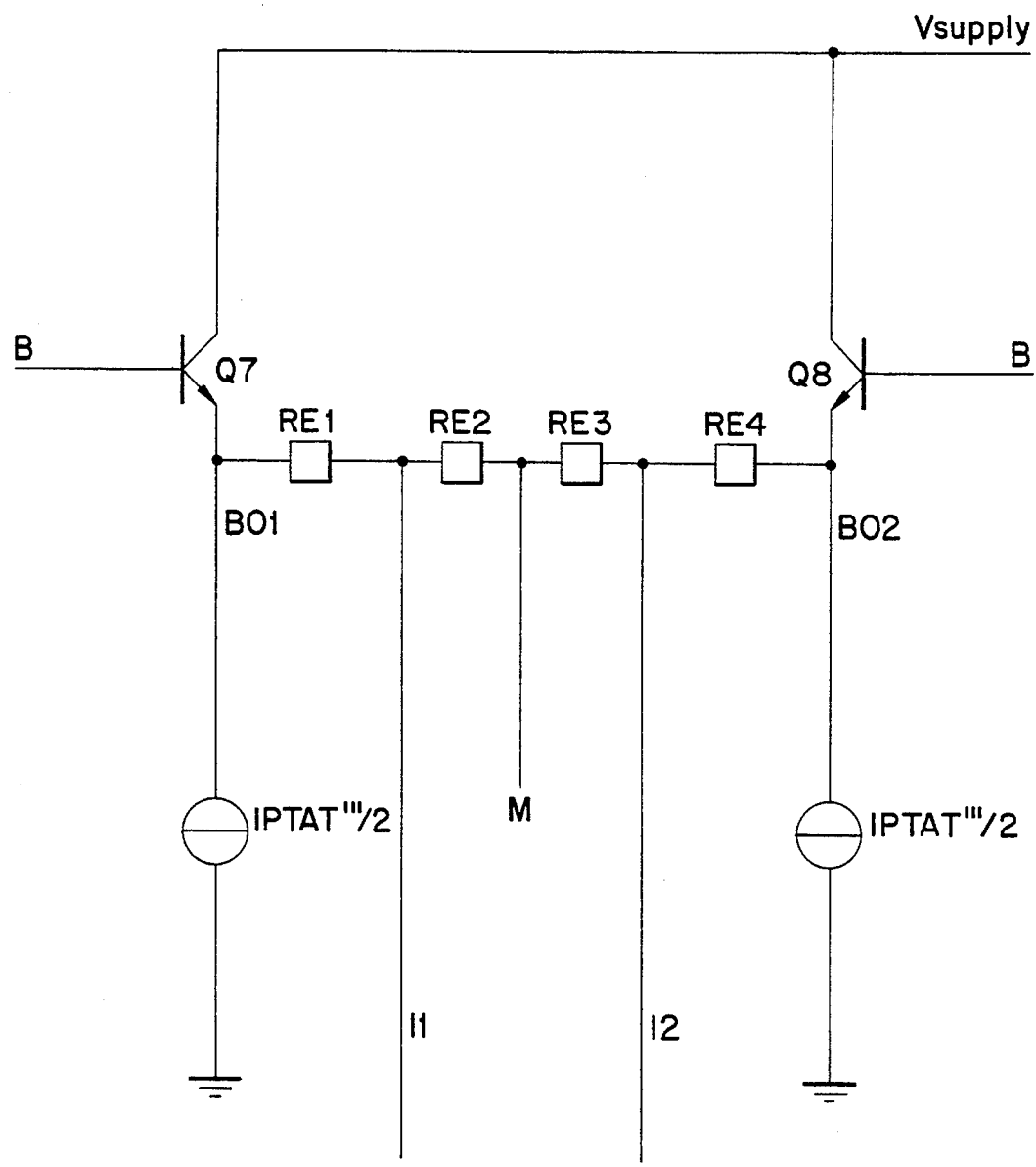
FIG. 12 illustrates an attenuator and differential buffer stage.

An attenuating log convertor section would be connected as one of the cascaded sections, generally the first section, of a complete logarithmic convertor. The attenuating section is constructed in a manner similar to the logarithmic convertor sections described above, including a constant-gain amplifier, a reference voltage source, and a sense amplifier, but the attenuating log section has an additional differential buffer amplifier and an attenuator. FIG. 12 is an electrical schematic diagram of one example of the differential buffer amplifier and attenuator.

The differential buffer amplifier comprises two identical bipolar transistors Q7, Q8 connected as emitter followers, each biassed by a respective PTAT tail-current source $I_{PTAT4}'''/2$ as shown. The magnitudes of the PTAT currents supplied by these sources are just one-half of the tail currents supplied in the constant-gain amplifier. The PTAT currents eliminate the temperature dependency of the buffer amplifier's transfer function. The input terminals B of the buffer amplifier are the base terminals of the emitter followers, and they are connected to the differential input signal presented to the logarithmic convertor. The output terminals BO1, BO2 of the buffer amplifier are the emitter terminals of the emitter followers.

Between the output terminals BO1, BO2 there is connected a resistive attenuator that comprises a five-terminal network of four resistors RE1, RE2, RE3, RE4 connected in series. The resistor network is symmetrical with respect to its middle terminal. The outermost two terminals are respectively connected to the buffer amplifier output terminals BO1, B02. The middle terminal M carries the common-mode input voltage, and it serves in the reference voltage source as described below. The remaining two terminals I1, I2 are connected to the input terminals of a constant-gain amplifier G as described above, and these terminals present the attenuated input signal to the logarithmic convertor.

Similar to the above description for an ordinary log convertor section, the output voltage L at the common emitter output terminals of the constant-gain amplifier G includes a common-mode part and a logarithmic part. The common-mode part is eliminated by compensation with the reference voltage source R, which reproduces the common-mode part. As in the ordinary log convertor section described above, the reference voltage source R is derived from the constant-gain amplifier. In contrast to the ordinary convertor, however, the two input terminals of the reference voltage source are connected to the middle terminal M of the attenuator's resistor network, where the common-mode input voltage is present.

As described in connection with the ordinary reference voltage source, the common-mode input voltage at the terminal M should contain half the input signal value if the attenuating section is driven by an unbalanced input signal. A sense amplifier S measures the difference between the common emitter voltages of the reference voltage source R and the constant-gain amplifier G, and the sense amplifier S produces a differential output collector current as described above in connection with the ordinary Logarithmic convertor section.

The attenuating section's attenuation factor, which is the ratio of the differential voltage passed to the constant-gain amplifier G and the voltage at the input terminals of the buffer amplifier, is determined by the resistor network. To ensure proper takeover between the non-attenuating log sections described above and the attenuating section, the attenuation ratio must be the inverse of the constant gain realized in the constant-gain amplifier. If another attenuating section is added, its attenuation factor must be the inverse of the square of the gain, and so on.

An advantage of the attenuating section as compared to a direct attenuator such as used in the Analog Devices' AD640 is the better dynamic range of the logarithmic convertor. The maximum input signals of Applicants' convertor and the AD640 are equally large, but the signal to noise ratio at the circuit input is better when using an attenuating section as described by Applicants.

In accordance with another aspect of Applicants' invention, the limitation due to offset voltages of the low end of the log convertor's input voltage range can be eliminated by removing the d.c. offset voltages with a lowpass filter disposed in a feedback loop comprising the cascade of logarithmic convertor sections and the filter.

Figure 13:
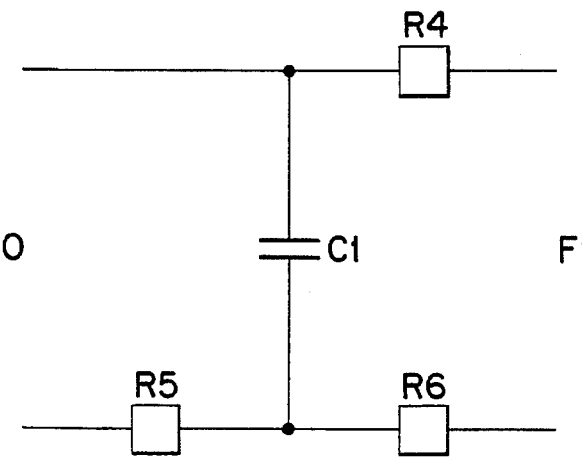
FIG. 13 illustrates an embodiment of a first-order loop filter.

Referring to the electrical schematic diagram of FIG. 13, the loop filter is a combination of passive components, viz., resistors R4, R5, R6 and capacitor C1, having two input terminals F1 that are connected to the linear output terminals COUT of the cascade of logarithmic sections. (As explained in connection with FIG. 7, the terminals COUT are the two collector terminals of the constant-gain amplifier of the last log convertor section in the cascade.) The loop filter also has two output terminals OF that are connected to the differential input of the cascade, i.e., to the base terminals of the differential pair in the constant-gain amplifier G in the first log convertor section in the cascade.

With the loop filter connected in this way, a feedback loop is formed that seeks to null the differential d.c. input voltage, thereby eliminating the operating range limitation due to d.c. offset voltages in the logarithmic convertor sections.

It is, of course, possible to embody the invention in specific forms other than those described above without departing from the spirit of the invention. The embodiments described above are merely illustrative and should not be considered restrictive in any way. The scope of the invention is determined by the following claims, rather than the preceding description, and all variations and equivalents which fall within the scope of the claims are intended to be embraced therein.

What is claimed is:

1. A logarithmic convertor for generating an electrical output signal having a value that is substantially a logarithm of a value of an electrical input signal provided to the convertor comprising:
    a cascade of log convertor sections, wherein each log convertor section comprises:
        means for differentially amplifying an electrical section input signal, wherein the amplifying means has a gain that is substantially constant with a temperature of the logarithmic convertor and generates a linear output signal having a value that is substantially linearly related to the value of the electrical section input signal and a log output signal having a value that is substantially a logarithm of the value of the electrical section input signal;
        means for generating a first reference voltage that is substantially equal to a common-mode component of the electrical section input signal, wherein the reference voltage generating means comprises a differential amplifier having a gain that is substantially constant with the temperature of the logarithmic convertor; and
        means for generating a section output signal having a value that is accurately logarithmically related to the value of the electrical section input signal for a predetermined operating range, wherein the section output signal is based on the log output signal and on the first reference voltage and compensates a temperature dependency of the log output signal; and
    the electrical input signal provided to the convertor is the electrical section input signal for a first log convertor section in the cascade; the linear output signal of the amplifying means in one log convertor section is the electrical section input signal amplified by the amplifying means in an immediately succeeding log convertor section in the cascade;
    means for generating a temperature-compensating signal, comprising:
        first means for generating an electrical signal having a value that is substantially logarithmically related to a value of an offset voltage;
        means for generating a second reference voltage that is substantially equal to a common-mode component of the electrical input signal provided to the convertor; and
        second means for generating an electrical signal having a value that is proportional to the temperature of the logarithmic convertor based on the electrical signal generated by the first means and on the second reference voltage; and
    output means for generating a temperature-compensated electrical signal having a value accurately logarithmically related to the value of the electrical input signal provided to the convertor based on the section output signals and the temperature-compensating signal.

2. The logarithmic convertor of claim 1, wherein each of the amplifying means, the means for generating the first reference voltage, and the means for generating the section output signals have transfer characteristics that are based on an exponential relationship of a PN junction.

3. The logarithmic convertor of claim 1, wherein the amplifying means, the means for generating the first and second reference voltages, and the first means each include first means for generating a current having a magnitude that depends on the temperature of the logarithmic convertor; and the means for generating the section output signals and the second means each include second means for generating a current having a magnitude that is independent of the temperature of the convertor.

4. The logarithmic convertor of claim 3, wherein each first current generating means includes a model of the respective amplifying means, each model being embedded in a feedback loop for controlling the gain of the amplifying means to be substantially constant with a temperature of the logarithmic convertor; and each second current generating means includes a model of the respective means for generating the section output signal, each model being embedded in a feedback loop for controlling the respective means for generating the section output signal.

5. The logarithmic convertor of claim 1, wherein at least one log convertor section further comprises means for attenuating its electrical section input signal.

6. The logarithmic convertor of claim 1, wherein the output means combines the section output signals and the temperature-compensating signal and converts the combined signal to an output voltage.

7. A logarithmic convertor for generating an electrical output signal having a value that is substantially a logarithm of a value of an electrical input signal provided to the convertor comprising:

a cascade of log convertor sections, wherein each log convertor section comprises:

a constant-gain differential amplifier comprising two input terminals for receiving an electrical section input signal, the input terminals being the base terminals of two bipolar transistors; means for generating a first current for biassing the bipolar transistors, the first current having a magnitude that is proportional to a temperature of the logarithmic convertor; a pair of linear output terminals for transmitting an electrical signal having a value that is substantially linearly related to the value of the electrical section input signal; and a log output terminal for transmitting an electrical signal having a value that is substantially a logarithm of the value of the electrical section input signal;

means for generating a reference voltage that is substantially equal to a common-mode component of the electrical section input signal, wherein the reference voltage source comprises a differential amplifier; means for generating a second current for biassing the differential amplifier, the second current having a magnitude that is proportional to the temperature of the logarithmic convertor; and an output terminal for transmitting the reference voltage; and a sense amplifier having a first input terminal electrically connected to the log output terminal of the constant-gain amplifier; a second input terminal electrically connected to the output terminal of the reference voltage generating means, the first and second input terminals being the base terminals of two respective bipolar transistors; means for generating a reference current for biassing the bipolar transistors, the reference current having a magnitude that is substantially constant with respect to the temperature of the logarithmic convertor; and a pair of output terminals for transmitting an electrical signal having a value that is accurately logarithmically related to the value of the electrical section input signal for a predetermined operating range; and the electrical input signal provided to the convertor is the electrical section input signal for a first log convertor section in the cascade; the linear output terminals of the constant-gain differential amplifier in one log convertor section are electrically connected to the input terminals of the constant-gain differential amplifier in an immediately succeeding log convertor section in the cascade; and the pairs of output terminals of the sense amplifiers of the log convertor sections are connected in parallel;

a temperature-compensating section having a pair of output terminals connected in parallel to the pairs of output terminals of the sense amplifiers of the log convertor sections, the temperature-compensating section further comprising:

a constant-gain differential amplifier comprising two input terminals for receiving an offset voltage, the input terminals being the base terminals of two bipolar transistors; means for generating a third current for biassing the bipolar transistors, the third current having a magnitude that is proportional to the temperature of the logarithmic convertor; and a log output terminal for transmitting an electrical signal having a value that is substantially logarithmically related to the value of the offset voltage;

means for generating a reference voltage that is substantially equal to a common-mode component of the electrical input signal provided to the convertor; and a sense amplifier having a first input terminal electrically connected to the log output terminal of the temperature-compensating section's constant-gain amplifier; a second input terminal electrically connected to the output terminal of the temperature-compensating section's reference voltage generating means, the first and second input terminals being the base terminals of two respective bipolar transistors; means for generating a reference current for biassing the bipolar transistors, the reference current having a magnitude that is substantially constant with respect to the temperature of the logarithmic convertor; and the pair of output terminals, the pair of output terminals being for transmitting an electrical signal having a value that is proportional to the temperature of the logarithmic convertor; and output means, electrically connected to the pairs of output terminals of the log convertor sections and the temperature-compensating section, for generating a temperature-compensated electrical signal having a value accurately logarithmically related to the value of the electrical input signal provided to the convertor.

8. The logarithmic convertor of claim 7, wherein the constant-gain differential amplifier and the differential amplifier in the reference voltage generating means in each log convertor section and in the temperature-compensating section each include two pairs of Darlington-connected bipolar transistors.

9. The logarithmic convertor of claim 7, wherein the means for generating the first current and the means for generating the second current in each log convertor section include a model of the constant-gain differential amplifier in the respective log convertor section, and the means for generating the third current in the temperature-compensating section comprises a model of the constant-gain differential amplifier in the temperature-compensating section.

10. The logarithmic convertor of claim 7, wherein at least one log convertor section further comprises means for attenuating its electrical section input signal.

* * * * *